United States Patent
Kano

(10) Patent No.: US 8,634,197 B2
(45) Date of Patent: Jan. 21, 2014

(54) BOARD MODULE AND PRINTER

(75) Inventor: Tomohisa Kano, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 362 days.

(21) Appl. No.: 13/159,750

(22) Filed: Jun. 14, 2011

(65) Prior Publication Data
US 2011/0309727 A1  Dec. 22, 2011

(30) Foreign Application Priority Data

Jun. 17, 2010  (JP) ................................ 2010-138080

(51) Int. Cl.
*H05K 7/00*  (2006.01)

(52) U.S. Cl.
USPC ............................ 361/729; 361/807; 361/810

(58) Field of Classification Search
USPC .......................... 361/728–730, 807, 809, 810
See application file for complete search history.

(56) References Cited

U.S. PATENT DOCUMENTS

| | | | | |
|---|---|---|---|---|
| 5,947,769 A | * | 9/1999 | Leonard et al. | 439/607.53 |
| 6,056,574 A | * | 5/2000 | Yeomans et al. | 439/327 |
| 6,229,709 B1 | * | 5/2001 | Hardt et al. | 361/753 |
| 6,319,037 B1 | * | 11/2001 | Lai | 439/327 |
| 6,381,149 B1 | * | 4/2002 | Megason et al. | 361/801 |
| 7,556,501 B2 | | 7/2009 | Morita | |
| 7,641,495 B1 | * | 1/2010 | Sun | 439/327 |

FOREIGN PATENT DOCUMENTS

| | | |
|---|---|---|
| JP | 2000-332463 | 11/2000 |
| JP | 3669519 B | 4/2005 |
| JP | 2008-263042 | 10/2008 |

* cited by examiner

*Primary Examiner* — Hung S Bui

(57) ABSTRACT

There is provided a board module to be mounted on an electronic apparatus for adding functions to the electronic apparatus. A second board extends perpendicularly from a first board. The second board is locked to the first board at an abutting end which abuts on the first board. A plate-shaped board fixing member pinches and fixes a fixed end of the second board, which is parallel to the abutting end. The board fixing member is arranged parallel to the first board. The board fixing member is formed with a slit-shaped opening into which the fixed end is inserted, a pair of pinching projections protruding from an opening edge of the opening and pinching the fixed end from both front and rear surfaces of the second board, and a pair of slits being located adjacent to the pair of pinching projections, respectively and being parallel to the opening.

9 Claims, 8 Drawing Sheets

BOARD MODULE AND PRINTER

This application claims priority under 35 U.S.C §119 to Japanese Application No. 2010-138080, filed on Jun. 17, 2010, which is hereby incorporated by reference in its entirety.

BACKGROUND

The present invention relates to a board module to be mounted on an electronic apparatus for adding functions to the electronic apparatus, and to a printer having the board module.

Patent Document 1 discloses a board module which includes a first board, a second board fixed perpendicularly to the first board, and a pair of right and left fixing holders which fixes the second board to the first board (refer to Patent Document 1). In the pair of fixing holders, one fixing holder holds one lateral end of the second board, and the other fixing holder holds the other lateral end of the second board. That is, the right and left ends of the second board are held and fixed by the fixing holders disposed at the first board.

Patent Document 1: JP-A-2008-263042

However, in such a configuration, it is necessary to secure the space to be held at right and left ends on the second board, and it is necessary to secure, on the first board, the disposition space for the fixing holders, in the places on the first board, abutting the right and left ends of the second board. Therefore, there is a problem in that the circuit formation area becomes narrow, and the first board and second board cannot avoid being large-sized. On the other hand, although it is also considered that the space to be held and the disposition space are made small, there is a problem in that high fixing strength is not obtained in this case.

SUMMARY

It is therefore an object of at least one embodiment of the present invention to provide a board module and a printer which can make a first board and a second board small and can obtain high fixing strength.

According to an aspect of the embodiments of the present invention, there is provided a board module to be mounted on an electronic apparatus for adding functions to the electronic apparatus, the board module comprising: a first board; a second board extending perpendicularly from the first board, the second board being locked to the firsts board at an abutting end which abuts on the first board; and a plate-shaped board fixing member pinching and fixing a fixed end of the second board, which is parallel to the abutting end, the board fixing member being arranged parallel to the first board, wherein the board fixing member is formed with: a slit-shaped opening into which the fixed end is inserted; a pair of pinching projections protruding from an opening edge of the opening and pinching the fixed end from both front and rear surfaces of the second board; and a pair of slits being located adjacent to the pair of pinching projections, respectively and being parallel to the opening.

According to this configuration, a spring property can be given to the individual pinching projections by the slits. Therefore, the fixed end of the second board can be pinched and fixed by the board fixing member by press-fitting the fixed end of the second board to the pair of pinching projections. That is, since the fixed end of the second board is pinched and fixed by the plate-shaped board fixing member, the space of the second board to be held can be made small, and circuits can be space-efficiently arranged on the first board and the second board. Therefore, the first board and the second board can be made small. Additionally, since the second board is pinched and fixed at a position (fixed end) as distant as possible from the locking position to the first board, the second board can be effectively fixed. Therefore, high fixing strength can be obtained even in a small space to be held.

The board module may further comprise a conductive apparatus fixing frame holding the board fixing member, the apparatus fixing frame being fixed to the electronic apparatus in a state where the board module is mounted on the electronic apparatus. The fixed end of the second board may be formed with grounding wiring, and the board fixing member may be comprised of conductive material.

According to this configuration, the second board can be effectively electrically connected/grounded with a simple configuration by the conductive board fixing member and the apparatus fixing frame (noise removal). Electric connection of the second board is also effective for removal of the static electricity of the second board. Here, the term "conductive" means, specifically, that the surface electrical resistance value is $10^7 \Omega$ or less.

In the board module, the pinching projections may be disposed so as to be shifted from each other in an extending direction of the opening.

According to this configuration, since the stress from the pinching projections to the second board is released to the opposite side of the pinching projections, the load to the second board can be reduced, and damage to the second board can be suppressed. Additionally, in a case where the pair of pinching projections is formed by press blanking, the strength of a pressing die can be improved, and the life-span of the die can also be extended.

In the board module, the board fixing member may have a plurality of pairs of pinching projections which are disposed so as to be distributed in an extending direction of the opening.

According to this configuration, since the board fixing member is held and fixed in a plurality of places in the extending direction of the opening, fixing strength can be improved.

The board module may further comprise a connector mounted on one of the front and rear surfaces of the second board. The board fixing member may be formed with a pair of receiving projections protruding from the opening edge of the opening and facing the fixed end with a gap.

According to this configuration, even if the extraction and insertion force of the connector acts on the second board, the pair of receiving projections receives this force. Therefore, curving or damage of the second board of a predetermined value or more can be prevented, and extraction and insertion of the connector can be stabilized.

In the board module, the board fixing member may have a plurality of pairs of receiving projections which are disposed so as to be distributed in an extending direction of the opening.

According to this configuration, since the above extraction and insertion force can be received in a plurality of places in the extending direction of the opening (the extending direction of the fixed end), the curving or damage to the second board can be suppressed with high precision.

In the board module, the board fixing member may be formed with a reinforcing rib extending parallel to the opening and formed by bending one end of the board fixing member toward a side of the first board.

According to this configuration, by forming the board fixing member with the reinforcing rib, curving of the board fixing member can be suppressed, the strength of the board fixing member can be improved, and the board fixing member can be thinly formed by an equivalent amount.

In the board module, a microcomputer may be loaded on the first board.

According to this configuration, the function of the electronic apparatus can be markedly improved by mounting the board module on the electronic apparatus. In addition, the microcomputer indicates a circuit obtained by integrating a CPU or memories into one, that is, indicates an ultra-compact computer.

According to another aspect of the embodiments of the present invention, there is provided a printer comprising the board module described above.

According to this configuration, a printer which is small-sized and also has an information processing function can be provided by using a small-sized board module with high fixing strength. For example, it is possible to have an information processing function which can execute a POS application program

DETAILED DESCRIPTION OF THE EMBODIMENTS

Hereinafter, a board module related to one embodiment of the invention, and a printer mounted with the same will be described with reference to the accompanying drawings. This printer is a so-called receipt printer which prints image data for a receipt on receipt paper on the basis of the information from an external device to produce a receipt. In addition, a POS terminal, a keyboard, a scanner, a display, and the like are assumed as external instruments.

Figure 1A:
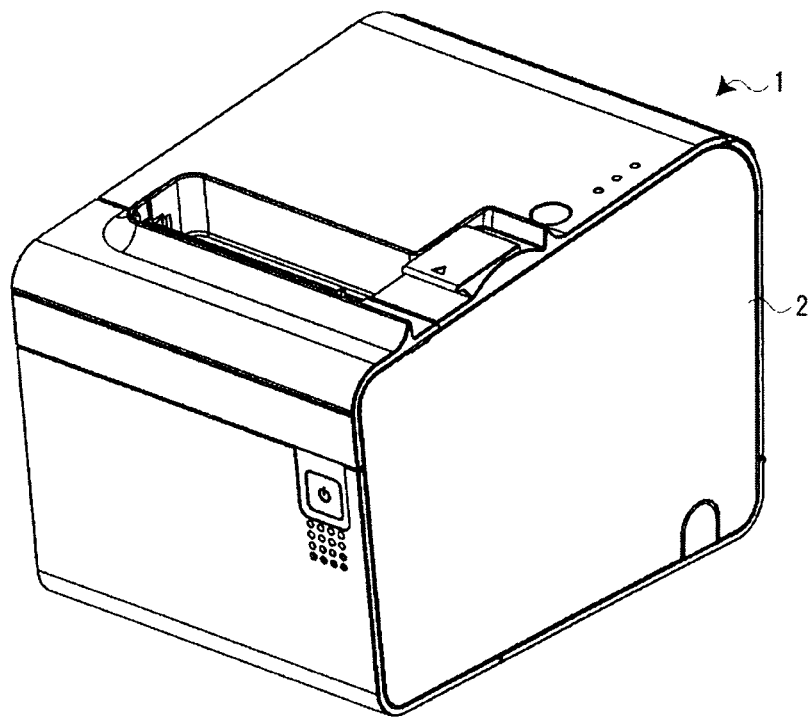
FIG. 1A is a perspective view illustrating a printer according to an embodiment of the present invention.
Figure 1B:
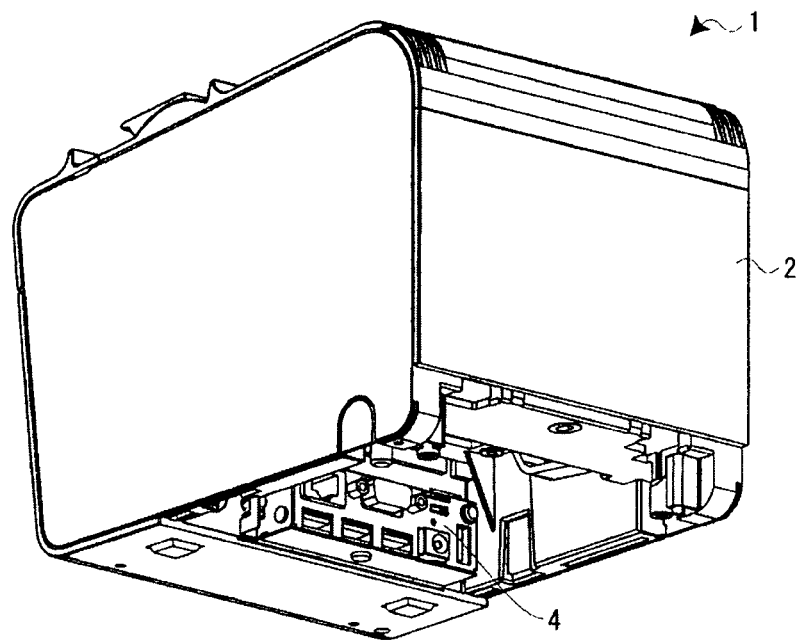
FIG. 1B is a perspective view illustrating the printer according to the embodiment.

As shown in FIGS. 1A and 1B, the printer 1 includes a printer body (electronic apparatus) 2 and an extended board module (board module) 4 mounted on the printer body 2. In the present embodiment, information processing functions are added to the printer body 2 by mounting the extended board module 4 mounted with a microcomputer (not shown). For example, it is assumed that the microcomputer is loaded with a simple POS application program, and the printer 1 is made to function as a spare POS terminal.

Next, the extended board module 4 will be described in detail. In addition, in the subsequent description, drawings illustrating that the extended board module 4 mounted on the printer 1 is turned upside down will be used, and the description will proceed with the near side, the deep side, the upper side, and the lower side in FIGS. 2 and 3 being defined as "front", "rear", "upper", and "lower", respectively. Additionally, the right side (left side in the drawings) with respect to the above-described front and rear is defined as "right", and the left side (right side in the drawings) with respect to the front and rear is defined as "left".

Figure 2:
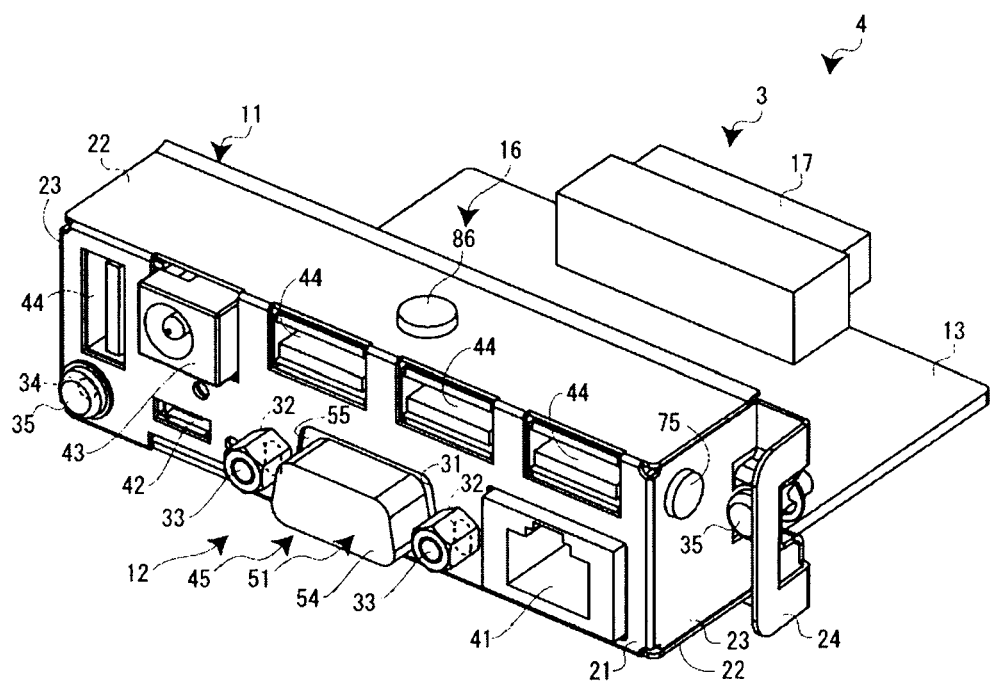
FIG. 2 is a perspective view illustrating an extended board module.
Figure 3:
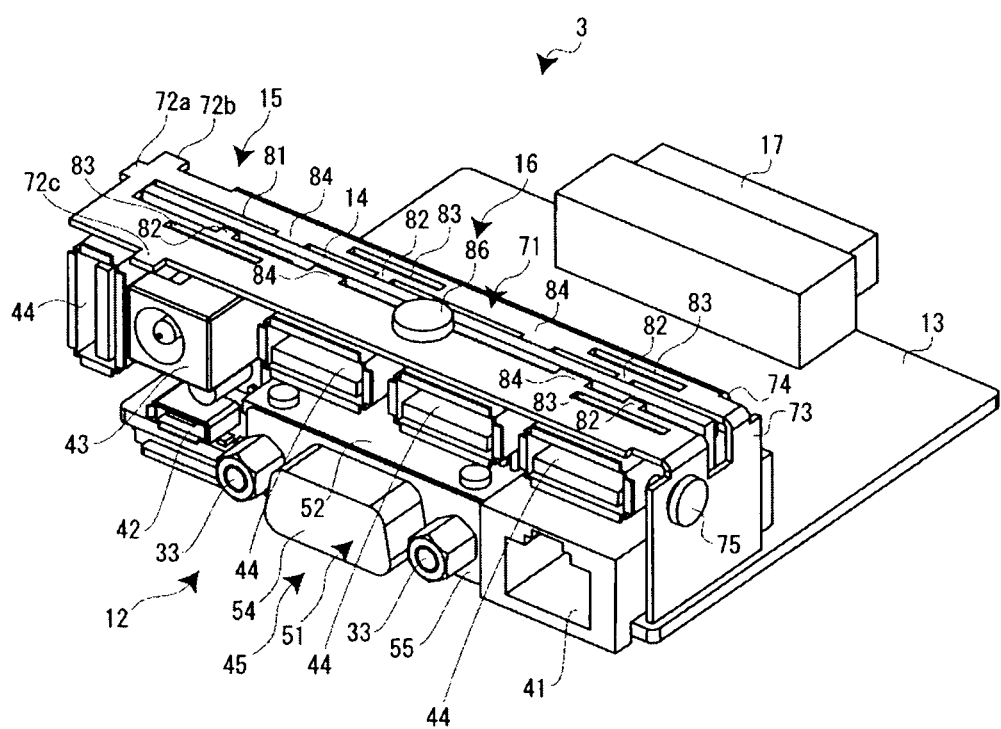
FIG. 3 is a perspective view illustrating the extended board module with no connector frame.
Figure 4:
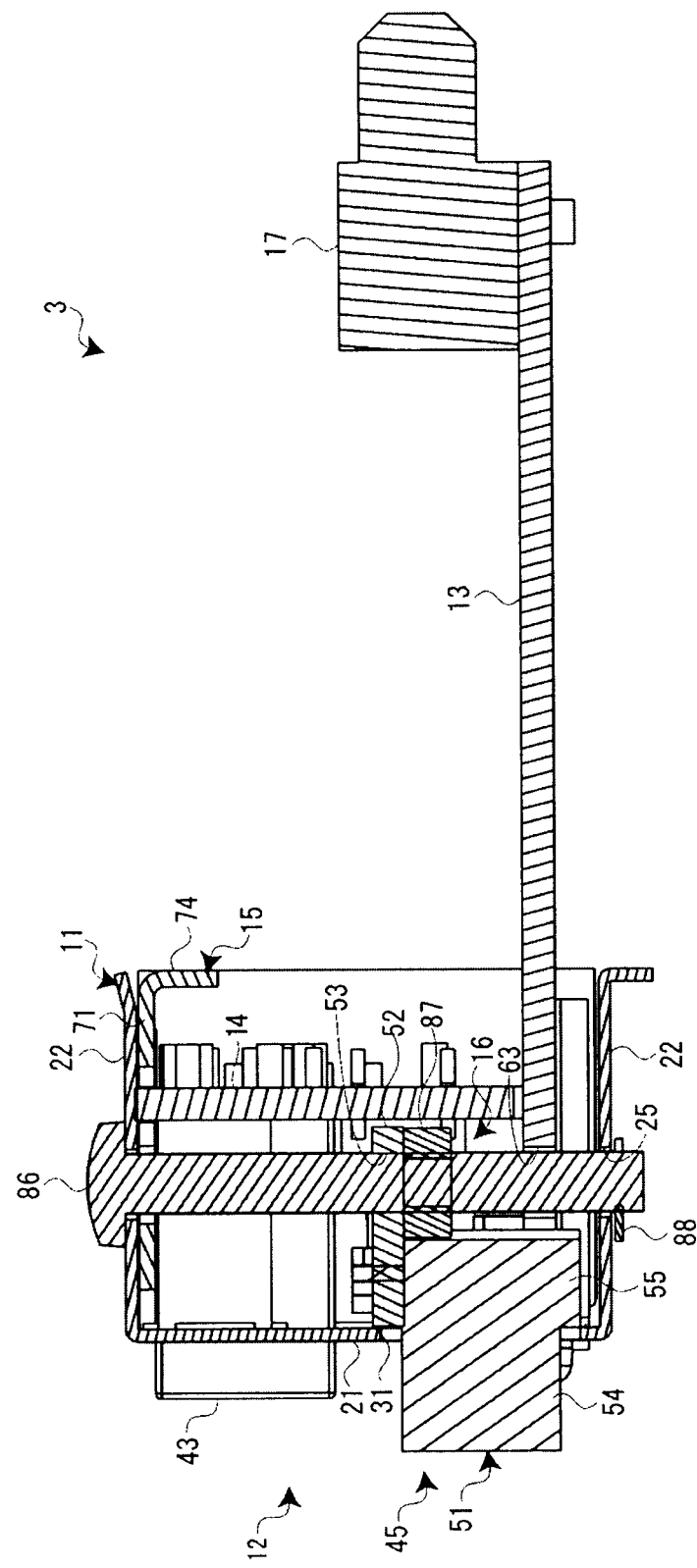
FIG. 4 is a side sectional view illustrating the extended board module.

As shown in FIGS. 2, 3, and 4, the extended board module 4 includes a box-shaped connector frame (apparatus fixing frame) 11 with an open rear surface, and a connector module 3 which mounts the connector frame 11. The connector module 3 includes a connector group 12 consisting of a plurality of external connectors including a VGA connector 45 exposed to the front surface of the connector frame 11, a main board (first board) 13 provided so as to extend rearward from the inside of the connector frame 11, a sub board (second board 14) erected perpendicularly to the main board 13 within the connector frame 11, a board holder plate (board fixing member) 15 provided along the top surface of the connector frame 11 to hold an upper end (fixing end) of the sub board 14, a height adjusting mechanism 16 which adjusts the height of the VGA connector 45, and an internal connector 17 for connection with the printer body 2. Also, a one-chip microcomputer (not shown) and the peripheral circuits thereof are built into the main board 13. Each external connector and the microcomputer, and the microcomputer and the internal connector 17 are respectively connected together by distribution cables 20 (refer to FIG. 7). In addition, the microcomputer is an integrated circuit which has a CPU, a RAM, a ROM, and data storage units (flash ROM or the like).

As shown in FIGS. 2 and 4, the connector frame 11 is made of a metal plate of a conductive material, and includes a panel plate portion 21 which constitutes the front surface, a pair of upper and lower reinforcing plate portions 22 and 22 which extends perpendicularly, respectively, from upper and lower ends of the panel plate portion 21, a pair of right and left reinforcing plate portions 23 and 23 which extends perpendicularly, respectively, from right and left end of the panel plate portion 21, and an attaching plate portion 24 which is formed by folding back the end of the left reinforcing plate portion 23 and fixing the extended board module 4 with the printer body 2 with screws. That is, the connector frame 11 has a U-shape in a plan sectional view and a side sectional view by the panel plate portion 21, the upper and lower reinforcing plate portions 22 and 22, and the right and left reinforcing plate portions 23 and 23.

Additionally, the ends of the upper and lower reinforcing plate portions 22 and the ends of the right and left reinforcing plate portions 23 which constitute the corners of the box in the connector frame 11 come into contact with each other in a non joining state. Therefore, when the connector module 3 is mounted on the connector frame 11, the distal sides of the right and left reinforcing plate portions 23 and 23 are curved in an expanding direction, and are constructed such that mounting is not hindered and other parts are fitted in an open state. Additionally, each of the upper and lower reinforcing plate portions 22 has a through hole 25 through which an adjusting screw 86 to be described below is inserted.

The panel plate portion 21 includes an opening 31 for a connector which faces a connecting portion 54 on the side of a plug of a VGA connector 45 (Video Graphics Array connector) and exposes this connecting portion to the outside, a pair of through holes 32 and 32 for a pair of connector frame fixing screws 33 and 33 which are located on both sides of the opening 31 for a connector and are screwed to a frame attachment portion 55 of the VGA connector 45, and an attachment hole 34 for fixing the extended board module 4 to the printer body 2 with screws. That is, the connector frame 11 becomes an extended board module 4 screw-fixed to the connector module 3 by the pair of connector frame fixing screws 33 and 33, and the extended board module 4 is screw-fixed to the printer body 2 via the attachment portion 24 and the attachment hole 34 by a pair of extended board module fixing screws 35 and 35. Thereby, the extended board module 4 is fixed to the printer body 2 in a state where the above internal connector 17 is connected. According to this configuration, in a case where the extended board module 4 has failed, the extended board module fixing screws 35 and 35 may be removed so as to replace the extended board module 4, and repair time can be shortened. In addition, the opening 31 for a connector is formed so as to be broad in the height direction, and each through hole 32 is formed in a long hole which extends in the height direction. That is, the opening and the through holes are formed so as to permit adjustment of the height of the VCA connector 45 by the height adjusting mechanism 16.

As shown in FIGS. 2, 3, and 4, the connector group 12 is disposed such that an extraction and insertion direction thereof becomes parallel to the main board 13, and includes a LAN (Local Area Network) connector 41 and a micro USB (Universal Serial Bus) connector 42 which are loaded on a front end of the main board 13 and located at a lower left portion and a lower right portion thereof, respectively, a DC (Direct Current) connector 43 which is mounted on the front surface of the sub board 14 and is located at an upper right portion thereof, four USB connectors (connectors) 44 which are mounted on the front surface of the sub board and are aligned at an upper portion thereof, and the above VGA connector 45 held by the height adjusting mechanism 16. These connectors are disposed space-efficiently within the panel plate portion 21 while taking the connection of the respective plug connectors thereof into consideration. Additionally, these connectors are electrically connected to the sub board 14 by the distribution cables 20, and then electrically connected to the main board 13 via the sub board 14. In addition, the connection between the sub board 14 and the main board 13 may be performed by the distribution cables 20 or jumper leads, or the wiring lines on both the boards 13 and 14 may be directly connected together at a lower end of the sub board 14.

The VGA connector 45 includes a connector body 51 which has a connecting portion 54, and a connector board 52 which has the connector body 51 fixed to the lower surface thereof with screws (refer to FIG. 4). The connector board 52 extends parallel to the upper and lower reinforcing plate portions 22 or the main board 13, and has an insertion hole 53, through which an adjusting screw 86 as will be described below is inserted, at a central portion thereof. The connector body 51 includes the above connecting portion 54, and the frame attachment portion 55 which holds the connecting portion 54 and abuts on the connector frame 11 from the inside. That is, the pair of connector frame fixing screws 33 and 33 is screwed to the frame attachment portion 55 via the pair of through holes 32 and 32 (refer to FIG. 3). Thereby, the VGA connector 45 is screw-fixed to the connector frame 11 in a state where the connecting portion 54 is made to project from the panel plate portion 21 (refer to FIG. 2). In addition, the connector frame fixing screw 33 has a male thread hole formed at the axial center of a head thereof, and also functions as a retainer when a plug connector is connected, along with a female thread hole of the plug connector.

Figure 5:
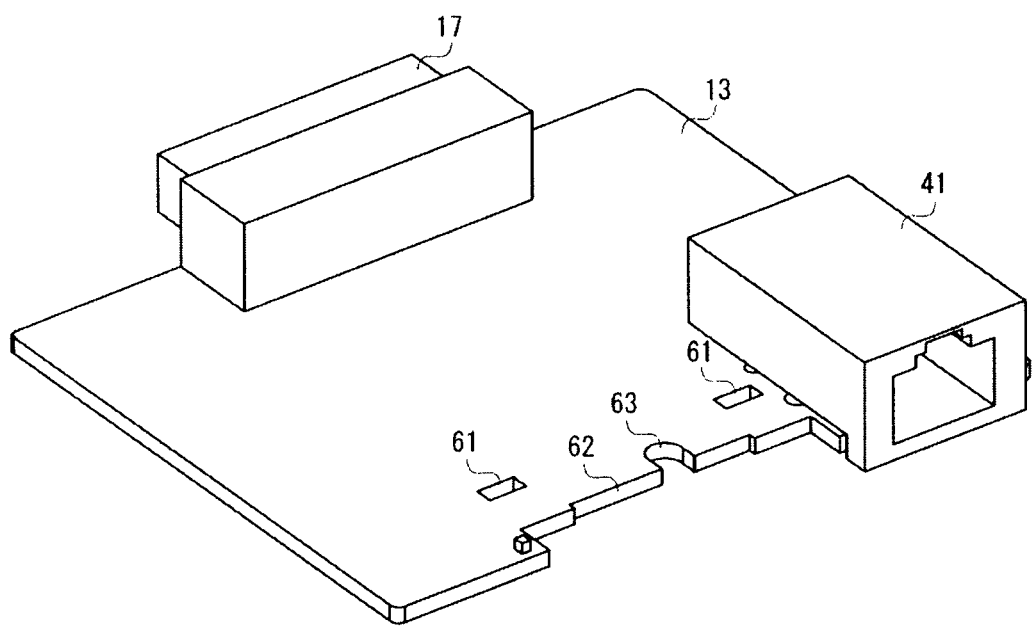
FIG. 5 is a perspective view illustrating the circumference of a main board.
Figure 6:
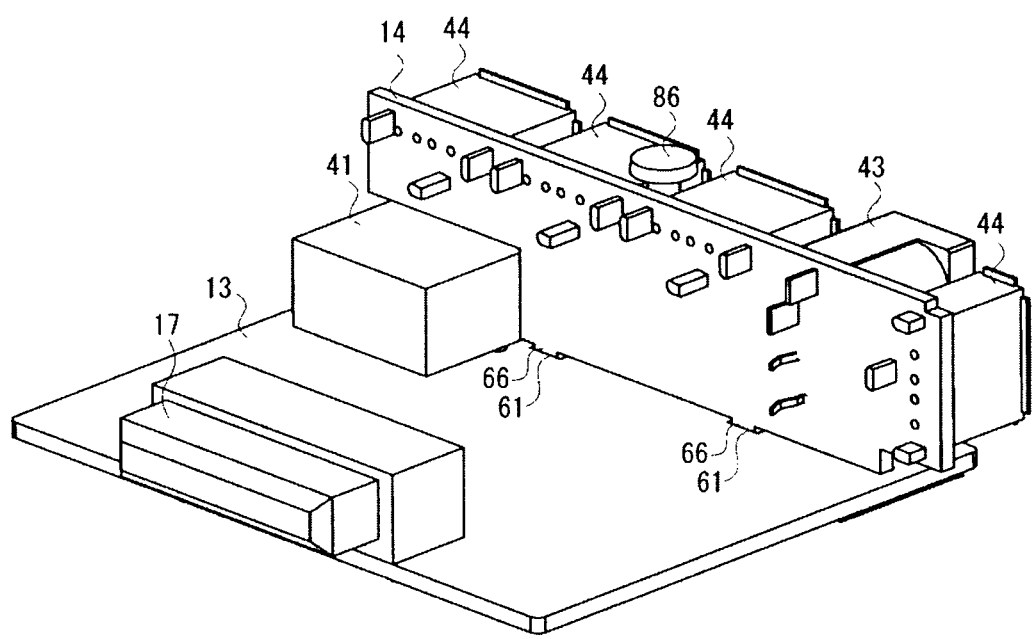
FIG. 6 is a rear perspective view illustrating the circumference of a sub board united with the main board.

As shown in FIG. 5, the main board 13 has the LAN connector 41 loaded on a front left end, the micro USB connector 42 loaded on a front right end although omitted in this drawing, and the internal connector 17 loaded on a rear central portion. Additionally, as shown in FIG. 6, a front-and-rear intermediate portion in the vicinity of the front of the main board 13 is formed with a pair of right and left rectangular locking holes 61 and 61 which engages with a pair of right and left locking projections 66 and 66 (as will be described below) formed on the sub board 14. That is, the sub board 14 is erected on the main board 13 in a state where a lower end of the sub board 14 is locked by engaging the pair of locking projections 66 and 66 while abutting a lower end (abutting end) of the sub board 14. Moreover, the VGA connector 45 is disposed on the main board 13 so as to overlap the main board 13 in the extraction and insertion direction of the VGA connector 45 (refer to FIG. 7). For this reason, a cutout portion 62 to which the VGA connector 45 retreats is disposed (formed) at the overlapping portion of the main board 13. An insertion opening 63 through which the adjusting screw 86 (as will be described below) is inserted is formed in a central rear end of the cutout portion 62 so as to be recessed.

As shown in FIGS. 3, 4, and 6, the sub board 14 extends perpendicularly and upwardly from the main board 13, and is erected (vertically installed) so as to traverse the whole right and left regions of the main board 13, excluding the portion which overlaps the LAN connector 41. The DC connector 43 and the four USB connectors 44 are mounted on the front surface of the sub board 14. Additionally, the pair of right and left locking projections 66 and 66 is formed at the end (lower end) of the sub board 14 on the side of the main board 13. Moreover, although omitted in the drawings, grounding wiring 35 (print wiring) is formed at the upper end of the sub board 14, and is adapted to be capable of performing grounding via the board holder plate 15. In addition, the upper end (fixed end) and lower end (abutting end) of the sub board 14 extend parallel to each other.

As shown in FIG. 3, the board holder plate 15 is formed by press-forming a conductive metal plate (sheet metal), extends parallel to the main board 13, and is fixed along the connector frame 11 from the inside. The board holder plate 15 is integrally formed by a fixing plate portion 71 which faces the upper end of the sub board 14 to pinch and fix the upper end, and a screw-fixing plate portion 73 which extends so as to be bent perpendicularly downward from a left end of the fixing plate portion 71. An engaging projection 72*a* which protrudes laterally from the right end, an abutting projection 72*b* which abuts rearward from the right end, and a spacer projection 72*c* which protrudes forward from the right end are integrally formed at the right end of the fixing plate portion 71. The engaging projection 72*a* engaged with an engaging hole (not shown) of the connector frame 11, and the board holder plate 15 and the connector frame 11 are mutually positioned in the right-and-left direction. The abutting projection 72*b* abuts on the printer body 2 when the right extended board module fixing screw 35 is screw-fixed to the printer body 2. The spacer projection 72*c* abuts on the inside (inside of the upper end of the panel plate portion 21) of the connector frame 11, and mutually positions the board holder plate 15 and connector frame 11 in the front-and-rear direction.

Additionally, a reinforcing rib 74, which is formed so as to be bent toward the main board 13 perpendicularly from the rear end of the fixing plate portion, is integrally formed at the fixing plate portion 71. The fixing plate portion 71 exhibits sufficient stress against bending in an up-and-down direction by the reinforcing rib 74. Also, the board holder plate 15 constructed in this way is supported on both sides by the connector frame 11 by engaging the engaging projection 72*a* of the right end with the engaging hole of the connector frame 11 in the state of being added to the inside of the connector frame 11 and by screw-fixing the screw-fixing plate portion 73 of the left end to the connector frame 11 by a locking screw 75. In addition, the locking screw 75 passes through the connector frame 11 from the outside, and is screwed to the screw-fixing plate portion 73 (refer to FIG. 2). That is, the board holder plate 15 is fixed to the connector frame 11, the upper end of the sub board 14 is pinched and fixed by the board holder plate 15, thereby preventing rattling or falling of the sub board 14 with respect to extraction and insertion of various connectors.

The fixing plate portion 71 includes a slit-shaped opening 81 into which the upper end of the sub board 14 is inserted, a plurality of pinching projections 82 which extends in the front-and-rear direction from the opening edge of the opening 81, protrudes into the opening 81, and pinches the upper end, a plurality of slits 83 which are located adjacent to the respective pinching projections 82 and is parallel to the opening 81, and a plurality of receiving projections 84 which extends in the front-and-rear direction from the opening edge of the opening 81, protrudes into the opening 81, and becomes a receptacle of the upper end. The slits 83 are formed in the vicinity of base ends of the pinching projections 82. The slits 83 correspond to the pinching projections 82 in one-to-one manner. Further, the opening 81 and the plurality of slits 83 are also formed by press blanking. In addition, the extending direction of the upper end of the sub board 14 and the extending direction of the opening 81 are the same.

The plurality of pinching projections 82 constitutes two sets obtained by distributing (aligning) a set of a pair of pinching projection 82 and 82, which is shifted in the front-and-rear direction and face each other, in the extending direction of the opening 81. The pair of pinching projections 82 and 82 is respectively brought into press contact with the front and rear surfaces of the upper end of the sub board 14 with a narrow width and a spring property by the slits 83 formed at a side of the base end of each pinching projection 82, and pinches the upper end. Additionally, the pair of pinching projections 82 which becomes a set is alternately disposed so as to be shifted from each other in the extending direction (extending direction of the upper end) of the opening 81. When the upper end of the sub board 14 is press-fitted into the opening 81, a pair of pinching projections 82 of each set pinches the upper end of the sub board 14. Thereby, the spring force of the pair of pinching projections 82 of each set, and the partial bending stress of the sub board 14 oppose each other, and the sub board 14 is firmly fixed to the fixing plate portion 71 without difficulty. Additionally, conduction of the sub board 14 to the connector frame 11 is secured via the fixing plate portion 71. In addition, the strength of a die when sheet metal parts are manufactured can be improved, and the lifespan of the die can also be extended.

Additionally, the reaction force which acts on each pinching projection 82 from the sub board 14 is alleviated by the pair of slits 83 and 83 disposed adjacent to the pair of pinching projections 82 and 82, and the spring property of each pinching projection 82 which runs short of toughness is secured. In addition, in order to secure the spring property of each pinching projection 82, a configuration in which a pressing spring is provided instead of the slits 88 may be adopted. However, since the press-fitting of the sub board 14 to the fixing plate portion 71 is performed only at the time of assembly, even if the pinching projections 82 are press-fitted to exceed an elastic limit, there is no problem.

The plurality of receiving projections 84 constitutes two sets obtained by distributing (aligning) a set of a pair of receiving projections 84 and 84, which is shifted in the front-and-rear direction and face each other, in the extending direction of the opening 81. The pair of receiving projections 84 and 84 faces the upper end of the sub board 14 with a minute gap, and when the extraction and insertion force of the plug connector 15 has acted on the sub board 14, the receiving projections receive this, and prevent the curving or damage to the sub board 14 of a predetermined value or more. That is, the receiving projections have a minute gap of such a degree that prevents curving or damage. Additionally, the pair of receiving projections 84 and 84 is disposed so as to be shifted from each other in the extending direction of the opening 81. In addition, the receiving projections 84 are formed so as to be broad with respect to pinching projections 82 in the extending direction of the opening 81.

Meanwhile, the board holder plate 15 is brought into contact with the grounding wiring formed at the upper end of the sub board 14 by the pinching projections 82, and is brought into contact with the conductive connector frame 11 by the engaging projections 72a or the screw-fixing plate portion 73. Further, the sub board 14 is grounded via the printer body 2 or one of the connectors from the connector frame 11. For this reason, the board holder plate 15 also functions as a conductive/grounding means of the sub board 14.

Figure 7:
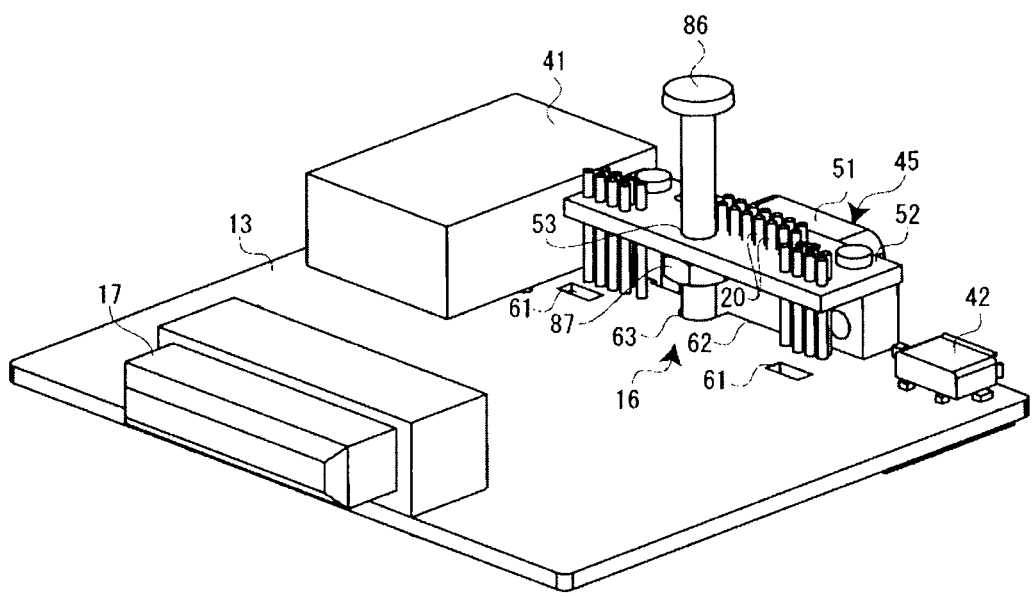
FIG. 7 is a rear perspective view illustrating the circumference of a height adjusting mechanism.

As shown in FIG. 7, the high adjusting mechanism 16 adjusts the position of the VGA connector 45 before being screw-fixed to the connector frame 11, in the height direction (direction vertical to the main board 13). The height adjusting mechanism 16 is attached to the connector frame 11 so as to be rotatable and axially immovable (fixed), and includes the adjusting screw 86 which extends in the height direction, and a fixing nut 87 which is fixed to the sub board 14 and screwed to the adjusting screw 86.

The adjusting screw 86 extends so as to be inserted through the upper reinforcing plate portion 22, the connector board 52, the main board 13, and the lower reinforcing plate portion 22, and is rotatably attached to the pair of upper and lower reinforcing plate portions 22 and 22 on both sides in a state where the seat surface of the head thereof is brought into contact with the upper reinforcing plate portion 22 from the upside. Additionally, the adjusting screw 86 is attached by a retaining ring 88 disposed at the lower surface of the lower reinforcing plate portion 22 so as not to advance and retreat in the axial direction. The fixing nut 87 is fixed to the connector board 52 by soldering, and is coaxially fixed to the insertion hole 53 of the connector board 52. That is, the rotation of the adjusting screw 86 is free and the advance and retreat thereof is fixed, and the rotation of the fixing nut 87 is fixed and the advance and retreat thereof is free.

When the adjusting screw 86 is rotated via the head thereof from the outside of the connector frame 11 by a tool or the like, the fixing nut 87 screwed to this adjusting screw advances and retreats in the axial direction (the height direction), and the connector board 52 fixed to this adjusting screw is moved. As a result, the overall VGA connector 45 having the connector board 52 is moved. After the extended board module 4 is assembled in this way, height adjustment of the VGA connector 45 can be performed from the outside of the connector frame 11. In addition, even in a case where other connectors, such as a serial connector, are attached instead of the VGA connector 45, easy compatibility can be ensured by height adjustment.

According to the above embodiment, in the board holder plate 15, a spring property can be given to the individual pinching projections 82 by the slits 83. Therefore, the upper end of the sub board 14 can be pinched and fixed by the board holder plate 15 by press-fitting the upper end of the sub board 14 to the pair of pinching projection 82 and 82. That is, since the upper end of the sub board 14 is pinched and fixed by the plate-shaped board holder plate 15, the space of the sub board 14 to be held can be made small, and circuits can be space-efficiently arranged on the main board 13 and the sub board 14. Therefore, the main board 13 and the sub board 14 can be made small. Additionally, since the sub board 14 is pinched and fixed at a position (upper end) as distant as possible from the locking position to the main board 13, the sub board 14 can be effectively fixed. Therefore, high fixing strength can be obtained even in a small space.

Additionally, as the conductive board holder plate 15 and the connector frame 11 are used, and grounding wiring is formed at the upper end of the sub board 14, the sub board 14 can be effectively electrically connected/grounded with a simple configuration. For example, noise of an electrical signal on the sub board 14 can be reduced.

Moreover, since the stress from the pinching projections 82 to the sub board 14 is released to the opposite side of the pinching projections 82 by disposing the pair of pinching projections 82 and 82 so as to be shifted from each other in the extending direction of the opening 81, the load to the sub board 14 can be reduced, and any damage of the main board 13 can be suppressed. Additionally, in a case where the pair of pinching projections 82 and 82 is formed by press blanking, the structure of a press die can be simplified.

Furthermore, since the board holder plate 15 is held and fixed in a plurality of places in the extending direction (extending direction of the upper end) of the opening 81 by proving a plurality of sets of the pair of pinching projections 82 and 82 so as to be distributed in the extending direction of the opening 81, fixing strength can be improved.

Additionally, even if the extraction and insertion force of the plug connector acts on the sub board 14 by providing the receiving projection 84, the pair of receiving projections 84 and 84 receives this force. Therefore, curving or damage to the sub board 14 of a predetermined value or more can be prevented, and extraction and insertion of the plug connector can be stabilized.

Moreover, since a plurality of sets of the pair of receiving projections 84 and 84 is provided, the above extraction and insertion force can be received in a plurality of places in the extending direction (extending direction of the upper end) of the opening 81, and the curving or damage of the sub board 14 can be suppressed with high precision.

Moreover, by forming the reinforcing rib 74 on the board holder plate 15, the curving of the board holder plate 15 can be suppressed, the strength of the board holder plate 15 can be improved, and the board holder plate 15 can be thinly formed by an equivalent amount.

Additionally, as a microcomputer is loaded on the main board 13, the function of the printer body 2 can be markedly improved by mounting the extended board module 4 on the printer body 2.

Figure 8:
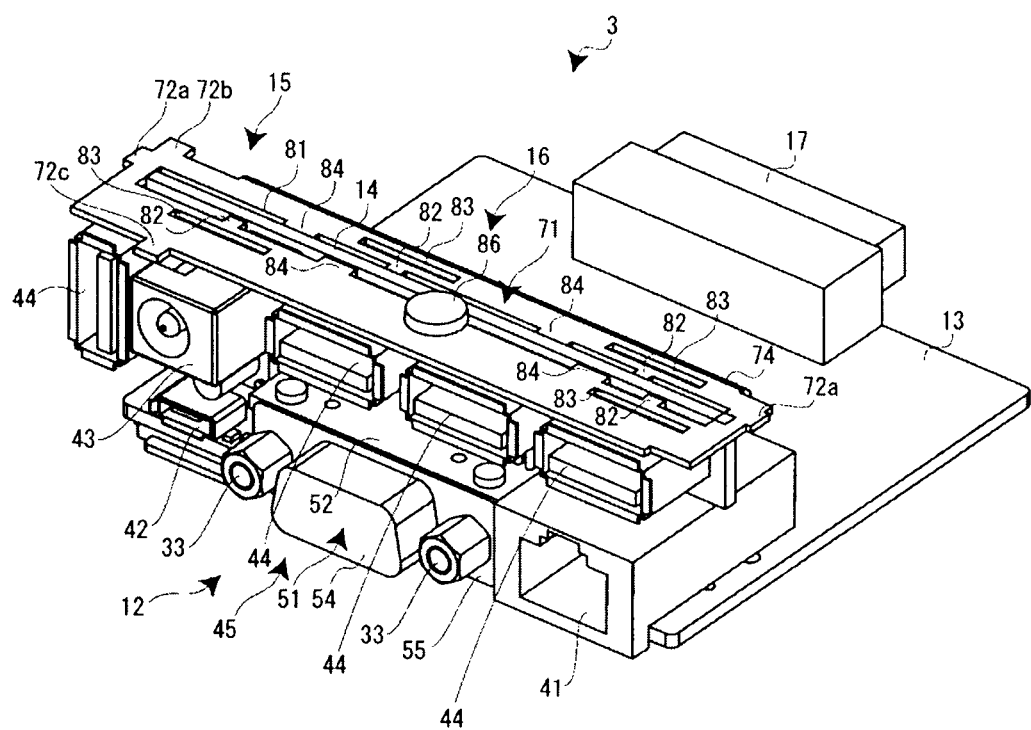
FIG. 8 is a perspective view illustrating a modification of a board holder plate.

In addition, although the board holder plate 15 in the embodiment is formed in an L-shape by the fixing plate portion 71 and the screw-fixing plate portion 73, it is also possible to omit the screw-fixing plate portion 73. In this case, as shown in FIG. 8, the engaging projection 72a which protrudes laterally is also formed at the left end of the fixing plate portion 71, and the left end of the fixing plate portion 71 engages with the connector frame 11 in this portion. In this case, engagement with the fixing plate portion 71 is performed with the right and left reinforcing plate portions 23 and 23 of the connector frame 11 being opened to the outside.

What is claimed is:

1. A board module to be mounted on an electronic apparatus for adding functions to the electronic apparatus, the board module comprising:
   a first board;
   a second board extending perpendicularly from the first board, the second board being locked to the firsts board at an abutting end which abuts on the first board; and
   a plate-shaped board fixing member pinching and fixing a fixed end of the second board, which is parallel to the abutting end, the board fixing member being arranged parallel to the first board,
   wherein the board fixing member is formed with:
      a slit-shaped opening into which the fixed end is inserted;
      a pair of pinching projections protruding from an opening edge of the opening and pinching the fixed end from both front and rear surfaces of the second board; and
      a pair of slits being located adjacent to the pair of pinching projections, respectively and being parallel to the opening.

2. The board module as set forth in claim 1, further comprising a conductive apparatus fixing frame holding the board fixing member, the apparatus fixing frame being fixed to the electronic apparatus in a state where the board module is mounted on the electronic apparatus,
   wherein the fixed end of the second board is formed with grounding wiring, and
   wherein the board fixing member is comprised of conductive material.

3. The board module as set forth in claim 1, wherein the pinching projections are disposed so as to be shifted from each other in an extending direction of the opening.

4. The board module as set forth in claim 1, wherein the board fixing member has a plurality of pairs of pinching projections which are disposed so as to be distributed in an extending direction of the opening.

5. The board module as set forth in claim 1, further comprising a connector mounted on one of the front and rear surfaces of the second board,
   wherein the board fixing member is formed with a pair of receiving projections protruding from the opening edge of the opening and facing the fixed end with a gap.

6. The board module as set forth in claim 5, wherein the board fixing member has a plurality of pairs of receiving projections which are disposed so as to be distributed in an extending direction of the opening.

7. The board module as set forth in claim 5, wherein the board fixing member is formed with a reinforcing rib extending parallel to the opening and formed by bending one end of the board fixing member toward a side of the first board.

8. The board module as set forth in claim 1, wherein a microcomputer is loaded on the first board.

9. A printer comprising the board module as set forth in claim 1.

* * * * *